United States Patent [19]
Mazure-Espejo et al.

[11] Patent Number: 6,004,856
[45] Date of Patent: Dec. 21, 1999

[54] MANUFACTURING PROCESS FOR A RAISED CAPACITOR ELECTRODE

[75] Inventors: Carlos Mazure-Espejo, Zorneding; Volker Weinrich, München, both of Germany

[73] Assignee: Siemens Aktiengesellschaft, Munich, Germany

[21] Appl. No.: 09/022,686

[22] Filed: Feb. 12, 1998

[30] Foreign Application Priority Data

Feb. 12, 1997 [DE] Germany .................. 197 05 352

[51] Int. Cl.$^6$ ................................... H01L 21/20
[52] U.S. Cl. .................... 438/396; 438/244; 438/253
[58] Field of Search ........................... 438/396, 381, 438/386, 393, 397–398, 244, 253, 387; 257/303, 306; 361/321.4

[56] References Cited

U.S. PATENT DOCUMENTS 5,352,622  10/1994  Chung .
5,706,164   1/1998  Jeng .................................. 361/321.4
5,717,236   2/1998  Shinkawata ........................... 257/306

FOREIGN PATENT DOCUMENTS

19515347 A1  11/1995  Germany .

*Primary Examiner*—Charles Bowers
*Assistant Examiner*—Craig Thompson
*Attorney, Agent, or Firm*—Herbert L. Lerner; Laurence A. Greenberg

[57] ABSTRACT

A raised basic structure is first made from a conducting or nonconducting, easily structurable substitute material. Electrode material, such as platinum, is then sputtered onto the basic structure. The layer thickness of the electrode material is greater on the surface and on the side walls of the basic structure than on the neighbouring surface. After a subsequent anisotropic etching process, the electrode material remains only on the basic structure, including the top surface and the side walls. The process is applicable to memory cells having a capacitor dielectric with a high-$\epsilon$-dielectric or ferroelectric material.

11 Claims, 3 Drawing Sheets

MANUFACTURING PROCESS FOR A RAISED CAPACITOR ELECTRODE

BACKGROUND OF THE INVENTION

FIELD OF THE INVENTION

The invention relates to integrated circuit manufacture, in particular to a method of manufacturing a capacitor electrode in an integrated semiconductor circuit.

Integrated semiconductor circuits frequently have capacitors which are raised during the manufacturing process, i.e., they are produced on an approximately horizontal surface. An example of this are so-called stacked capacitor memory cells, in particular in DRAM components. The choice of capacitor dielectric has an important effect on the space requirement of such a capacitor.

Conventional capacitors mostly make use of silicon oxide layers or silicon nitride layers as storage dielectric. Those have a dielectric constant of at most approximately 8. New paraelectric materials such as, for example, BST (barium strontium titanate, $BaSrTiO_3$) and similar materials, have a dielectric constant $\epsilon > 150$, and thus render a smaller capacitor possible.

Such memory elements with a paraelectric material as capacitor dielectric (DRAM) lose their charge, and thus their stored information, when the supply voltage fails or is turned off. Furthermore, because of the residual leakage current, conventional memory elements must continuously be rewritten (refresh time). Because of the different polarization directions, the use of a ferroelectric material as storage dielectric permits the construction of a nonvolatile memory, which does not lose its information in the event of failure of the supply voltage, and need not continuously be rewritten. The residual leakage current of the cell does not influence the stored signal. An example of such a ferroelectric material is PZT (lead zirconium titanate, $Pb(Zr,Ti)O_3$).

The production of these novel ferroelectric materials and paraelectric materials is generally performed at high temperatures in an oxidizing atmosphere. Consequently, there is no need, in particular for the first capacitor electrodes, of materials which are compatible with these conditions. A suitable material for this purpose seems to be an electrode made from platinum. The structuring of platinum, in particular of a relatively thin platinum layer is, however, a largely unsolved problem to date, since no suitable etching process has yet been developed, and since no volatile platinum compounds seem to be suitable for RIE processes. Etching processes to date are based on the application of a resist mask and etching in argon, oxygen or chlorine plasmas. In this case, because of the physical components of the process, only limited selectivity can be achieved with respect to mask materials and substrate.

SUMMARY OF THE INVENTION

It is accordingly an object of the invention to provide an improved manufacturing process for a capacitor electrode, in particular from platinum, which overcomes the above-mentioned disadvantages of the heretofore-known devices and methods of this general type and which makes it possible to integrate the manufacturing process into the manufacturing process of a DRAM cell having a high-$\epsilon$-paraelectric material or ferroelectric material as storage dielectric.

With the foregoing and other objects in view there is provided, in accordance with the invention, a manufacturing process for a capacitor electrode in an integrated semiconductor circuit. The novel process comprises the following steps:

forming a raised basic structure on a support and leaving a surface of the support adjacent the basic structure exposed, the basic structure having a geometrical shape with side walls and a top surface substantially corresponding to a geometrical shape of a capacitor electrode to be produced;

sputtering conducting electrode material and forming a sputter layer having a layer thickness on the top surface of the basic structure which is greater than a layer thickness on the surface of the support adjacent the basic structure; and anisotropically etching the electrode material such that the sputter layer is removed from the surface of the support adjacent the basic structure and an electrode material layer remains on the top surface and the side walls of the basic structure.

The raised basic structure is formed from conducting or nonconducting substitute material.

In accordance with an added feature of the invention, the electrode material is platinum.

In accordance with an additional feature of the invention, the basic structure or the electrode material is formed in contact with a conducting connecting structure contacting a conducting zone in the semiconductor substrate or a conductor track.

In accordance with another feature of the invention, the step of anistropically etching comprises sputter-etching the electrode material.

In accordance with again another feature of the invention, the basic structure is formed from the same material as the support.

In accordance with yet another feature of the invention, the process further comprises forming an oxygen diffusion barrier between the connecting structure and the electrode material.

In accordance with yet an additional feature of the invention, the basic structure is formed from a conductive barrier material for preventing oxygen diffusion.

In accordance with yet an added feature of the invention, a ferroelectric material or paraelectric material is subsequently applied to the capacitor electrode thus produced, and a second capacitor electrode is then formed on the ferroelectric material or paraelectric material.

The invention may be summarized as follows: first, the geometrical shape of the capacitor electrode is defined with a more easily structurable substitute material forming the so-called basic structure. This basic structure is raised on a support, and has an exposed surface and exposed side walls. Thereafter, a conducting electrode material is applied in a sputtering process. During such a process, a greater layer thickness is produced on the surface of the basic structure than on side walls and on the base (i.e. on the neighboring free support surface). The structure is then etched back in an anisotropic etching process. During such etching, the etching rate on horizontal surfaces, i.e., on the top surface and on the base (support) is equally rapid, but is negligible on the side walls. The support surface is etched free and the electrode material is completely removed here, whereas a layer of electrode material remains on the side walls and on the surface of the basic structure. The result is an insulated capacitor electrode which, for example, is separated from a simultaneously formed capacitor electrode of a neighboring memory cell.

In this invention the electrode material (e.g. platinum) need not be structured by employing plasma chemistry.

Instead, a substitute material which is easier to etch is structured to form a basic structure. The etching of electrode material is performed without a resist mask. The second (upper) electrode can be structured, for example, by a liftoff process, with the result that it is possible, here, as well, to dispense with a plasma etching process.

A further advantage is that no change of reactor apparatus is required between the deposition of the electrode material and the removal at sites outside the electrode.

The basic structure can be formed from a conducting or a nonconducting material. It is advantageous in the case of integration into a DRAM manufacturing process with one of the novel storage dielectrics to form the basic structure from a material which acts as an oxygen diffusion barrier in the later high-temperature process and prevents the oxidation of deeper lying structures. The capacitor electrode can preferably be connected via a connecting structure to a conductor track or a conductive zone, specifically by means of the basic structure (if conducting material is used) or by means of the electrode material.

The invention described herein is particularly useful and advantageous in the cell field of a DRAM memory. Due to the multiplicity of closely neighboring capacitors only a thin layer of the electrode material is sputtered on to the support surface (relative to the surface of the basic structure), with the result that only a thin layer need be removed in the anisotropic etching process.

Other features which are considered as characteristic for the invention are set forth in the appended claims.

Although the invention is illustrated and described herein as embodied in a manufacturing process for a raised capacitor electrode, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing figures.

DESCRIPTION OF THE PREFERRED EMBODIMENTS

Figure 1:
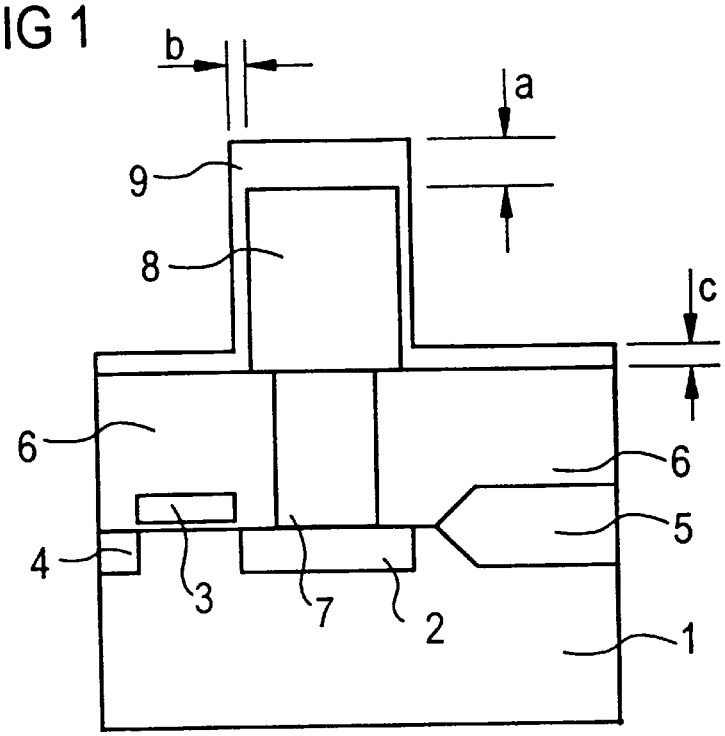
FIGS. 1 to 3 are diagrammatical sectional views taken through a semiconductor configuration, illustrating a first exemplary embodiment of the process.

Reference is now had to the figures of the drawing in detail and first, particularly, to FIG. 1 thereof, which explains the method by way of the example of a DRAM memory cell. A MOS transistor with doped regions 2, 4 and a gate 3 is produced in a silicon semiconductor substrate 1. The MOS transistor (2,3,4) is separated from the transistor of a neighboring memory cell by an insulating region 5. The structure is covered with an insulating layer 6, for example silicon oxide, and thus represents the support for the capacitor. The doped region 2 can be connected through the insulating layer 6 via a connecting structure 7 made, for example, from tungsten or polysilicon. As substitute material for forming the basic structure, titanium nitride or another conductive barrier material is applied to the support, which preferably has a planarized surface, and structured with the aid of a conventional etching process. The basic structure 8 is formed in this way and overlaps the connecting structure 7 over an adequately large area. Complete coverage is not mandatory in this case. The geometrical dimensions of the basic structure 8 depend chiefly on the desired capacitance value. A typical value for the height (layer thickness) is 500 nm. Platinum is now sputtered on to the arrangement as electrode material 9. The sputtering conditions are selected depending on the device in such a way that the best possible edge coverage and a microcrystalline layer are obtained. Because of the shading effects, the layer thickness c on the support surface adjacent to the basic structure and on the side walls of the basic structure 8 (thickness b) is less than on the surface of the basic structure (thickness a). In this exemplary embodiment, when a platinum film of thickness 100 nm is deposited onto titanium nitride a layer thickness ratio a:c:b for the top side, support surface and side wall of approximately 3:1.5:1 is obtained. The layer thickness on the top corresponds to that which would be obtained under the same conditions on a plane substrate.

Figure 2:
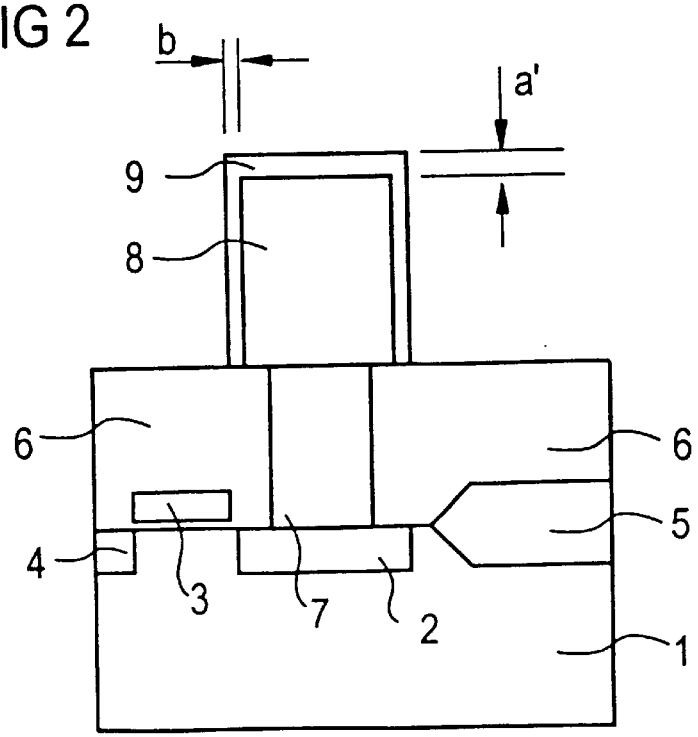

Referring now to FIG. 2, the above structure is then subjected to sputter etching. Since sputter etching is performed using a directional ion current, the etching rate on the horizontal surfaces is equally rapid, but negligible on the (approximately) vertical side walls. The etching time is set in such a way that the platinum layer on the support surface adjacent to the basic structure is removed, while it is only thinned and not removed on the basic structure itself. In the exemplary embodiment of a DRAM cell field, this means that the capacitor electrode is separated from a neighboring electrode. The remaining layers have a thickness ratio a':b after etching of approximately 1.5:1 between the top side and side wall. The capacitor electrode is thus finished.

Figure 3:
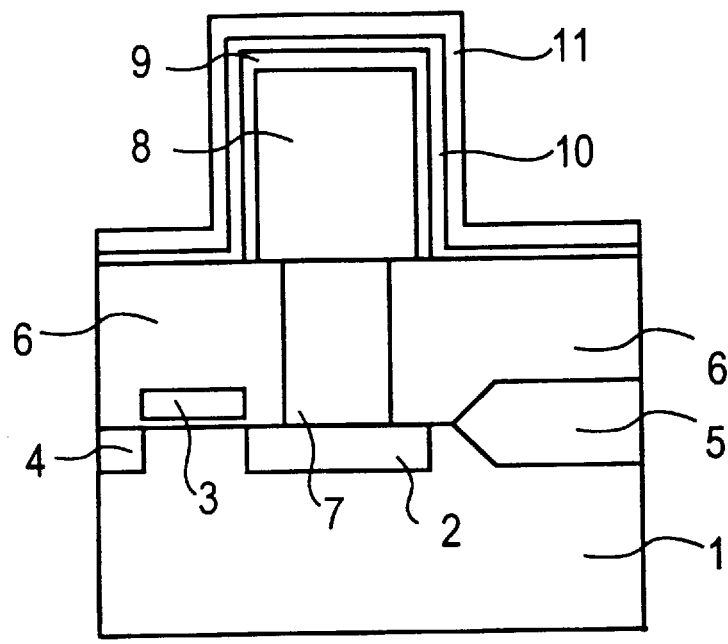

Referring now to FIG. 3, the memory capacitor is finished by forming a capacitor dielectric 10, preferably a high-$\epsilon$-dielectric, over the entire surface. In the case of a FRAM, a ferroelectric material is deposited instead. Suitable methods are known to those of skill in the art (for example from the article by C. Hwang, Appl.Phys.Lett. 67, 1995, pp. 2819ff). Since the basic structure 8 is formed from an oxygen diffusion barrier, the surface of the connecting structure 7 is not oxidized in this case. (Otherwise a suitable barrier would need to be installed between the connecting structure 7 and dielectric material 10.) The upper electrode 11, for example, is then likewise produced from platinum.

Figure 4:
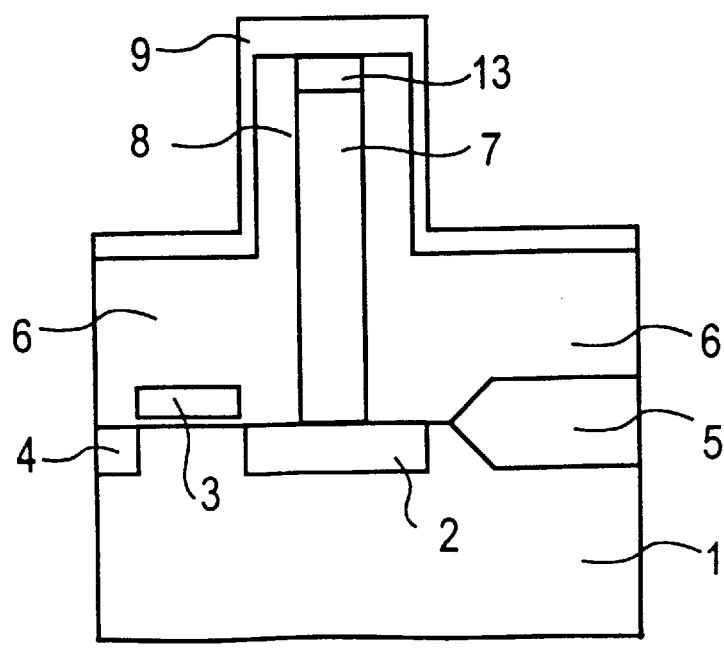
FIGS. 4 to 6 are similar views illustrating further exemplary embodiments.
Figure 5:
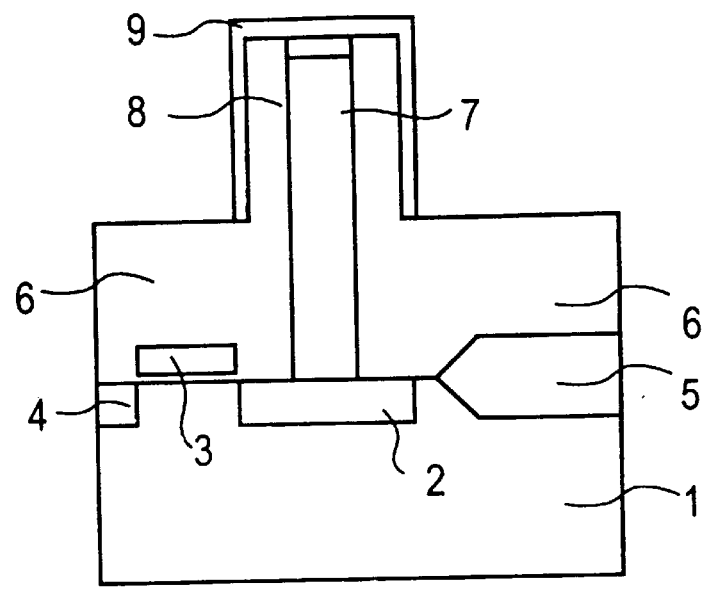

Referring now to FIGS. 4 and 5, in the second exemplary embodiment, the basic structure 8 is formed from a nonconducting substitute material, for example from silicon oxide or silicon nitride. As in the first example, this substitute material can be applied to the preferably planarized support and structured to form the basic structure 8. To simplify the process, the basic structure 8 can be formed from the same material as the layer 6 serving the purpose of covering the underlying structures or planarization, i.e., the layer 6 is applied with a sufficiently larger layer thickness, in order to form from it both the support and the basic structure 8. In other words, the basic structure is formed from a material of the support. Sputtering with the electrode material 9 (FIG. 4), and anisotropic etching (FIG. 5) are performed as explained above. In the case of a nonconducting substitute material, a connection of the electrode material 9 is required, that is to say it is necessary here for a conductive contact to the electrode material 9 to be produced from the doped region 2 of the transistor. This can be performed by having the connecting structure 7 reach up to the electrode material 9 and extend, for example, up to the top side of the basic structure 8. If, because of later oxygen-rich heat treatments, a barrier 13 should be required between the connecting structure 7 and the electrode material, this must likewise be installed, for example as represented. The barrier 13 can consist of WN in the case of a connecting structure made from W. The capacitor can be produced as explained above.

Figure 6:
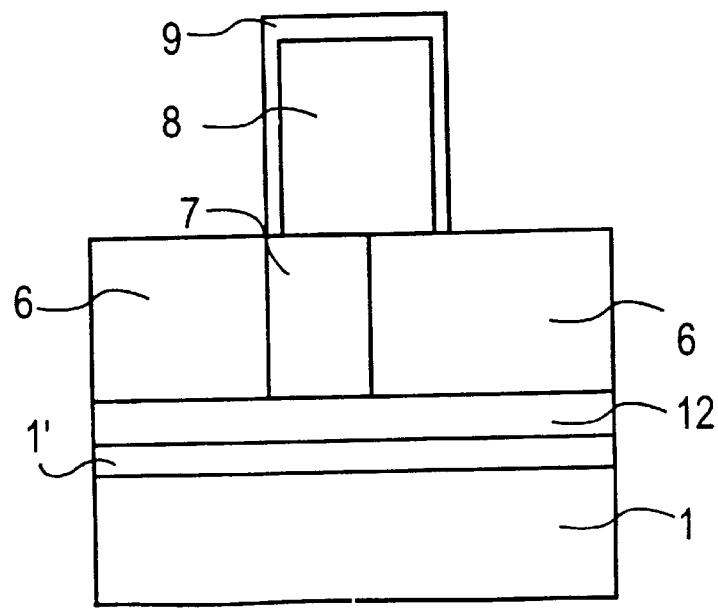

Referring now to FIG. 6, in the case of a nonconducting substitute material for the basic structure 8, the connection of the electrode material 9 can also be achieved by an offset of the basic structure 8. The connecting structure 7, for example made from tungsten or polysilicon, then has contact with the electrode material on the side wall of the basic structure. Furthermore, in this exemplary embodiment the connection is also shown to a deeper lying conductor track 12, which rests on an insulating layer 1'. The remainder of the process will be carried as explained with reference to the above-described first embodiment.

We claim:

1. A manufacturing process for a capacitor electrode in an integrated semiconductor circuit, the process which comprises the steps of:

forming a raised basic structure on a support and leaving a surface of the support adjacent the basic structure exposed, the basic structure having a geometrical shape with side walls and a top surface substantially corresponding to a geometrical shape of a capacitor electrode to be produced;

sputtering conducting electrode material and forming a sputter layer having a layer thickness on the top surface of the basic structure which is greater than a layer thickness on the surface of the support adjacent the basic structure; and anisotropically etching the electrode material such that the sputter layer is removed from the surface of the support adjacent the basic structure and an electrode material layer remains on the top surface and the side walls of the basic structure.

2. The process according to claim 1, wherein forming step comprises forming the raised basic structure from conducting or nonconducting substitute material.

3. The process according to claim 1, wherein the electrode material is platinum.

4. The process according to claim 1, wherein the step of forming the basic structure comprises forming the basic structure in contact with a conducting connecting structure contacting a conducting zone in the semiconductor substrate or a conductor track.

5. The process according to claim 1, wherein the step of forming the sputter layer comprises forming the electrode material in contact with a conducting connecting structure contacting a conducting zone in the semiconductor substrate or a conductor track.

6. The process according to claim 1, wherein the step of anistropically etching comprises sputter-etching the electrode material.

7. The process according to claim 1, wherein the step of forming the basic structure comprises forming the basic structure from a material of the support.

8. The process according to claim 1, which further comprises forming an oxygen diffusion barrier between the connecting structure and the electrode material.

9. The process according to claim 1, wherein the step of forming the basic structure comprises forming the basic structure from a conductive barrier material for preventing oxygen diffusion.

10. The process according to claim 1, which further comprises: subsequently applying a ferroelectric material or paraelectric material to the capacitor electrode produced after the anisotropic etching, and applying a second capacitor electrode on the ferroelectric material or paraelectric material.

11. A process for manufacturing a memory cell in an integrated semiconductor circuit, the process which comprises:

integrating a plurality of capacitors in a semiconductor substrate, and forming capacitor electrodes each contacting a respective one of the capacitors, the forming step comprising:

forming a raised basic structure on a support and leaving a surface of the support adjacent the basic structure exposed, the basic structure having a geometrical shape with side walls and a top surface substantially corresponding to a geometrical shape of the capacitor electrode to be produced;

sputtering conducting electrode material and forming a sputter layer having a layer thickness on the top surface of the basic structure which is greater than a layer thickness on the surface of the support adjacent the basic structure; and anisotropically etching the electrode material such that the sputter layer is removed from the surface of the support adjacent the basic structure and an electrode material layer remains on the top surface and the side walls of the basic structure.

* * * * *